United States Patent [19]

Kim

[11] Patent Number: 5,260,907
[45] Date of Patent: Nov. 9, 1993

[54] REPAIR CIRCUIT FOR INTEGRATED CIRCUITS

[75] Inventor: Seung M. Kim, Seoul, Rep. of Korea

[73] Assignee: Hyundai Electronics Industries Co., Ltd., Kyoungkido, Rep. of Korea

[21] Appl. No.: 701,527

[22] Filed: May 16, 1991

[30] Foreign Application Priority Data

May 18, 1990 [KR] Rep. of Korea ............... 1990-7169

[51] Int. Cl.$^5$ ............................................. G11C 7/00
[52] U.S. Cl. ................................. 365/201; 365/200; 371/10.3
[58] Field of Search ............... 365/200, 201; 371/10.1, 371/10.2, 10.3

[56] References Cited

U.S. PATENT DOCUMENTS

| | | | |
|---|---|---|---|
| 4,689,494 | 8/1987 | Chen et al. | 365/200 |
| 4,714,839 | 12/1987 | Chung | 365/200 |
| 4,975,881 | 12/1990 | Kagami | 371/10.3 |
| 4,987,560 | 1/1991 | Hamano et al. | 365/200 |
| 5,058,059 | 10/1991 | Matsuo et al. | 371/10.3 |
| 5,140,554 | 8/1992 | Schreck et al. | 365/201 |

FOREIGN PATENT DOCUMENTS 3272099 12/1991 Japan ............................... 371/10.3

Primary Examiner—Robert J. Pascal
Assistant Examiner—Tan Dinh
Attorney, Agent, or Firm—Darby & Darby

[57] ABSTRACT

A repair circuit for integrated circuits adapted for selecting and repairing a storage cell having a fault, and a main fuse adapted for operating the repair circuit. The repair circuit comprises a plurality of p-channel MOSFETs and a plurality of fuses. A NAND gate has as inputs, an output signal from said repair circuit and a control signal. The control signal is generated as the address of the selected cell is varied. The control signal is a pulse which transits from a low lever to a high level and back to a low level again as the address is varied. The repair circuit reduces power consumption in integrated circuits by allowing current to flow therein only when the address of the selected cell is varied.

3 Claims, 3 Drawing Sheets

REPAIR CIRCUIT FOR INTEGRATED CIRCUITS

BACKGROUND OF THE INVENTION

1. Field of The Invention

The present invention relates in general to a repair circuit for repairing storage cells in an integrated storage device, memory cells having a fault, and more particularly to a repair circuit for in-L,(? grated circuits which is capable of reducing power consumption therein by switching off unnecessary current incoming thereinto.

1. Description of the Prior Art

In design of a storage device, conventionally, there has been desired that a repair circuit should repair storage cells having a fault for the purpose of integration of the storage device allowing many information to be stored in one chip and therefore of its set-up in yield.

Referring to FIG. 1, a conventional repair circuit is shown to comprise a repair means 1 including a plurality of p-channel MOSFETs P1-Pn and a plurality of fuses FP1-FPn coupled parallel to the p-channel MOSFETs P1-Pn for selecting and repairing a storage cell having a fault. Each gate of the p-channel MOSFETs P1-Pn is adapted to input an address decoding output and each drain thereof is connected to the fuses FP1-FPn. Also, the above-mentioned conventional repair circuit comprises a main fuse means 2 adapted for operating the repair means 1 upon detecting an address for the cell having the fault, a pair of n-channel MOSFETs T1 and T2 connected to the repair means 1 and adapted for operating in accordance with an output from the main fuse means 2, and an inverter G3 connected to an output stage of the repair means 1 for outputting a signal REDY.

Now, the operation of the above-mentioned conventional repair circuit will be described.

First, upon detecting an address for a cell having a fault, fuses F1 and F2 in the main fuse means 2 are cut to operate the repair means 1. Then, of fuses FP1-FPn connected to p-channel MOSFETs P1-Pn in the repair means 1, fuses connected to p-channel MOSFETs in which gates input an address decoding output for a cell having no fault are cut, while fuses connected to p-channel MOSFETs in which gates input an address decoding output for the cell having fault are maintained naturally. As the fuses F1 and F2 in the main fuse means 2 are cut, an output signal A from the main fuse means 2 always is at a high state enabling the n-channel MOSFETs T1 and T2 in which each gate inputs the output signal A from the main fuse means 2 to be at ON state. Therefore, if the address for cell having fault is selected, the decoding output at a low state goes to a high state enabling an output signal B from the repair means 1 to be made a low state. Finally, the output signal B at the low state is inverted into a high state by the inverter G3 which then outputs a high signal REDY into which the output signal B was inverted thereby, thereby allowing the cell having fault to be repaired.

In the conventional repair circuit as mentioned above, however, when an address for a cell having no fault is selected after said repairing step, the decoding output at a high state goes to a low state enabling p-channel MOSFETs P1-Pn for the uncut fuses in which each gate inputs the decoding output at the low state to be made ON state since fuses connected to the p-channel MOSFETs in which gates input the address decoding output for cell having no fault are not cut, thereby allowing current to flow through the n-channel MOSFETs T1 and T2 in operation. Unfortunately, this current flow results in unnecessary power consumption in the repair circuit.

SUMMARY OF THE INVENTION

Therefore, it is an object of the present invention to provide a repair circuit for integrated circuits which is capable of reducing power consumption therein by switching off unnecessary current flowing continually thereinto when it selects storage cells having no fault after repairing storage cells having a fault, by means of a control signal EQYB generated as address is varied.

In accordance with the present invention, the object can be accomplished by providing a repair circuit for integrated circuits comprising: a repair means including an output stage and adapted for selecting and repairing a storage cell having a fault; a main fuse means including an output stage and adapted for operating said repair means; a NAND gate adapted for inputting an output signal from said repair means and a control signal; a first n-channel MOSFET including a drain connected to said output stage of said repair means, a gate adapted to input an output from said NAND gate and a source; a second n-channel MOSFET including a gate adapted to input an output signal from said main fuse means, a drain connected to said source of said first n-channel MOSFET and a source connected to a ground; and an inverter connected to said output stage of said repair means for outputting a signal to repair said storage cell having fault.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF PREFERRED EMBODIMENTS

Figure 1:
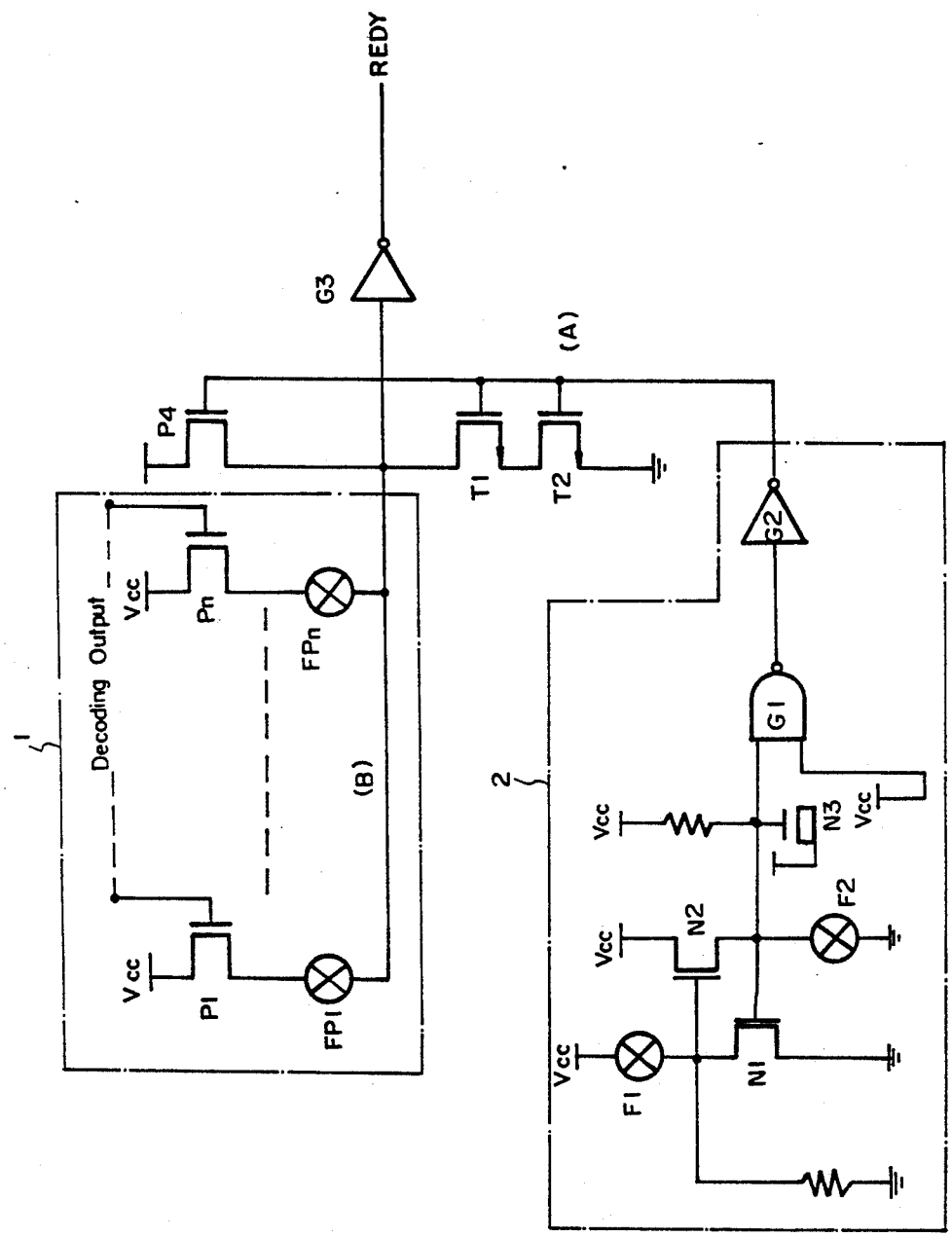
FIG. 1 is a schematic diagram of a conventional repair circuit.
Figure 2:
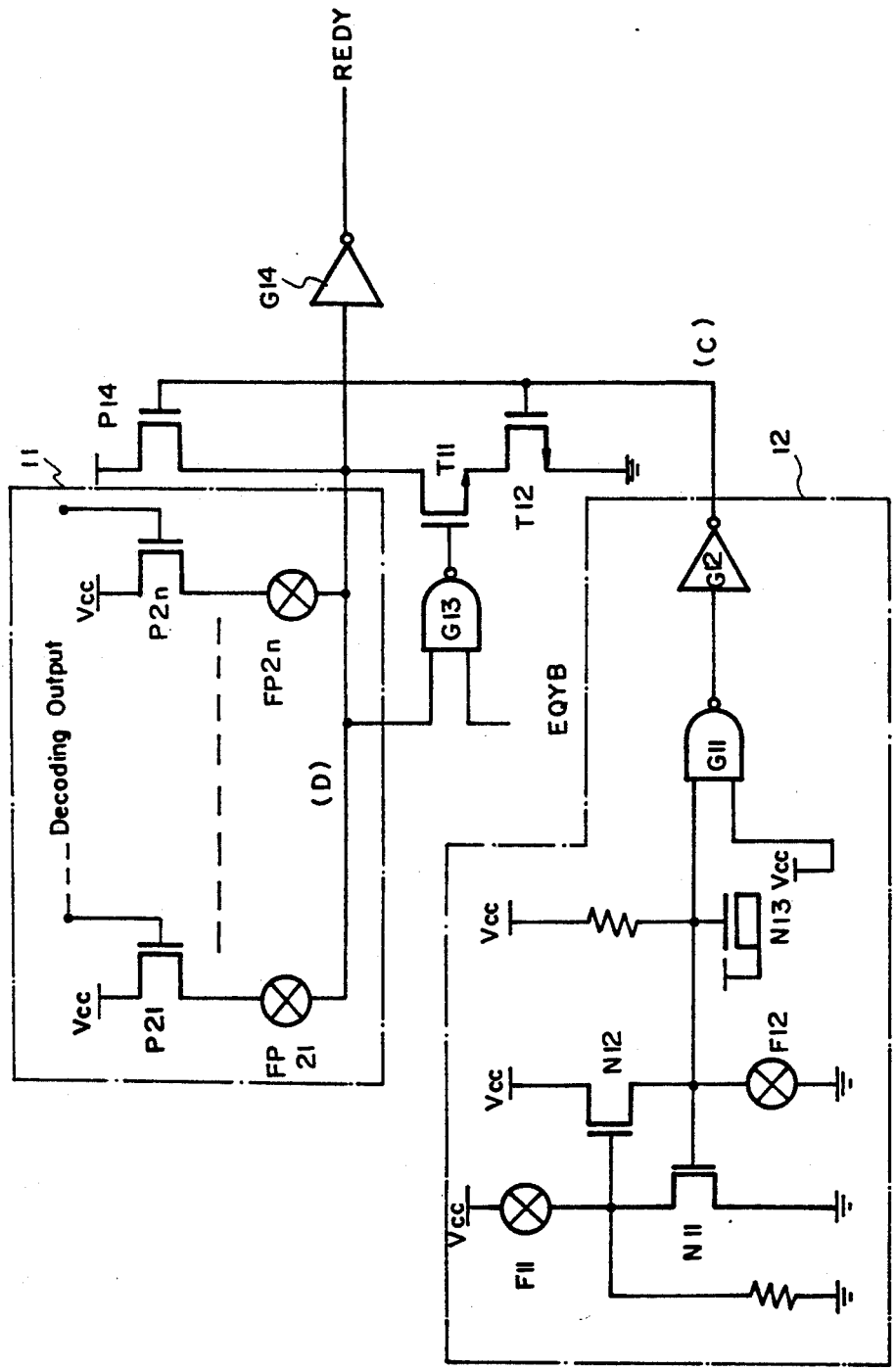
FIG. 2 is a schematic diagram of a repair circuit in accordance with the present invention.
Figure 3A:
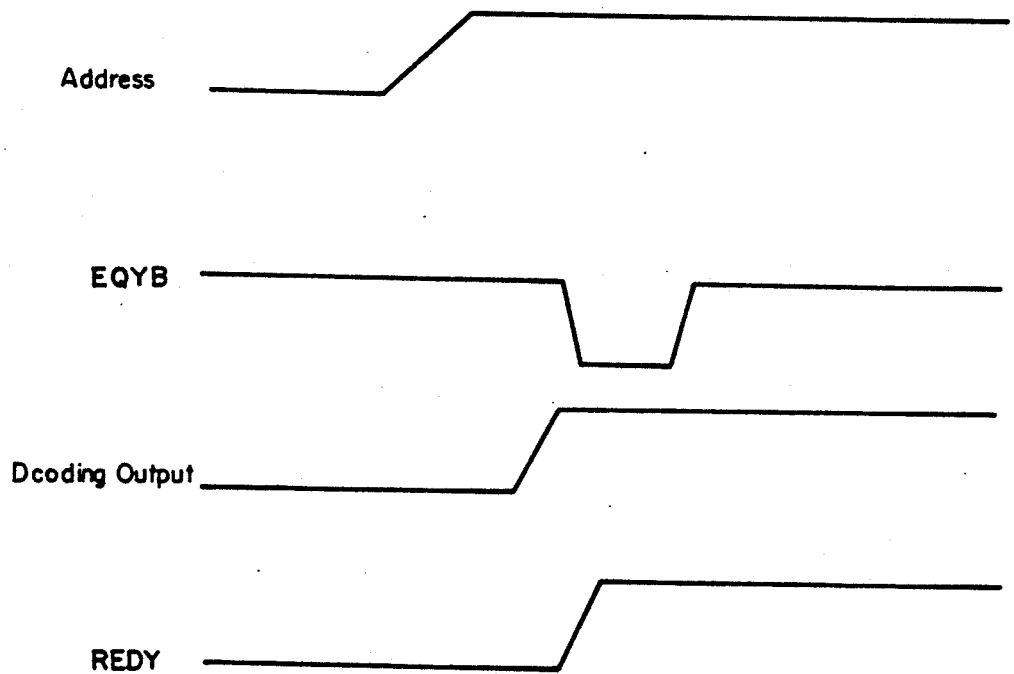
FIG. 3a shows waveform diagrams of signals from each component shown in FIG. 2 when a storage cell having a fault is selected by the repair circuit in FIG. 2.
Figure 3B:
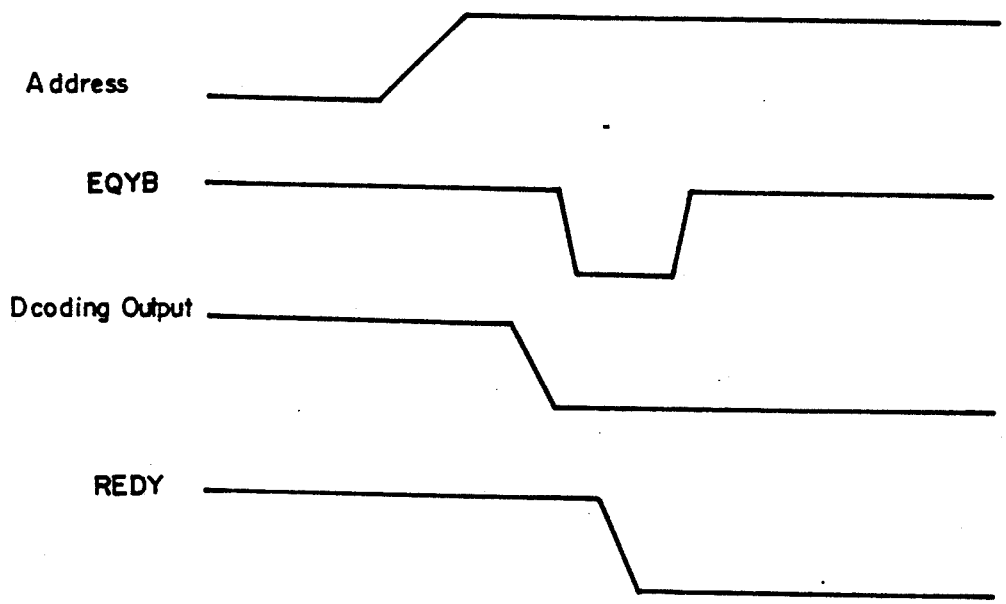
FIG. 3b shows waveform diagrams of signals from each component shown in FIG. 2 when a storage cell having no fault is selected by the repair circuit in FIG. 2.

FIG. 2 is a schematic diagram of a repair circuit in accordance with the present invention, and FIGS. 3a and 3b show waveform diagrams of signals from each component shown in FIG. 2 when a storage cell having a fault is selected and when a storage cell having no fault is selected by the repair circuit in accordance with the present invention, respectively. In these drawings, the numeral 11 designates a repair means, 12 a main fuse means, F11, F12 and FP21-FP2n fuses, G11 and G13 NAND gates, G12 and G14 inverters, and N11-N13, P14, P21-P2n, T11 and T12 MOSFETs.

First, a construction of a repair circuit in accordance with the present invention will be described with reference to FIG. 2.

Referring now to FIG. 2, the repair circuit in accordance with the present invention is shown to comprise a repair means 11 including a plurality of p-channel MOSFETs P21-P2n and a plurality of fuses FP21-FP2n coupled parallel to the p-channel MOSFETs P21-P2n for selecting and repairing a storage cell having a fault. Each source of p-channel MOSFETs P21-P2n is connected to a power source Vcc, each gate thereof is adapted to input an address decoding output and each drain thereof is connected to one stage of the fuses FP21-FP2n. On the other hand, other stage of the fuses FP21-FP2n is connected to an output stage of the repair means 11.

Also, the repair circuit of the present invention comprises a main fuse means 12 including fuses F11 and F12, N-channel MOSFETs N11 and N12, NAND gate G11 and inverter G12 for operating the repair means 11 upon detecting an address of the cell having the fault. Further, the repair circuit of the present invention comprises a NAND gate G13 for inputting an output signal D from the repair means 11 and a control signal EQYB generated as address is varied, a pair of n-channel MOSFETs T11 and T12, and an inverter G14. A drain of the n-channel MOSFET T11 is connected to the output stage of the repair means 11 and a gate thereof is adapted to input an output from the NAND gate G13. On the other hand, a drain of the n-channel MOSFET T12 is connected to a source of the n-channel MOSFET T11, a gate thereof is adapted to input an output signal C from the main fuse means 12 and a source thereof is connected to a ground. Also, the inverter G14 is connected to the drain of the n-channel MOSFET T11 to output a final output signal REDY.

Next, the operation of the repair circuit of the construction in accordance with the present invention as above-mentioned will be described in detail with reference to FIGS. 3a and 3b.

First, upon detecting an address for a cell having a fault, fuses F11 and F12 in the main fuse means 12 are cut to operate the repair means 11. Then, of fuses FP21-FP2n connected to p-channel MOSFETs P21-P2n in the repair means 11, fuses connected to p-channel MOSFETs in which gates input an address decoding output for a cell having no fault are cut, while fuses connected to p-channel MOSFETs in which gates input an address decoding output for the cell having fault are maintained naturally. As the fuses F11 and F12 in the main fuse means 12 are cut, the output signal C from the main fuse means 12 always is at a high state enabling the n-channel MOSFET T12 in which gate is connected to an output stage of the main fuse means 12 to be at ON state. Also, the output signal D from the repair means 11 at initial state is at a high state. Therefore, if the address for cell having fault is selected, the decoding output at a low state goes to a high state enabling the NAND gate G13 to input at its one terminal the control signal EQYB generated as address is varied, pulse of which transits from low level to high level and again contrary as address is varied. In result, if the control signal EQYB at a high state goes to a low state, the output from the NAND gate G13 is made a high state enabling the n-channel MOSFET T11 to be at ON state, thereby allowing the output signal D from the repair means 11 to be at a low state. Although the output signal D from the repair means 11 is at a low state and the control signal EQYB then returned to the NAND gate G13 goes to a high state, the output signal D from the repair means 11 can be maintained at a low state because the n-channel MOSFET T11 is continually maintained at ON state. Finally, the output signal D from the repair means 11 maintained at the low state is inverted into a high state by the inverter G14 which then outputs the high signal REDY into which the output signal D from the repair means 11 was inverted thereby, thereby allowing the cell having fault to be repaired.

When an address for a normal cell, a cell having no fault is selected after said repairing step, the control signal EQYB is generated and the decoding output at a high state goes to a low state enabling p-channel MOSFETs P21-P2n for the uncut fuses in which each gate inputs the decoding output at the low state to be made ON state since fuses connected to the p-channel MOSFETs in which gates input the address decoding output for cell having no fault are not cut, thereby the output signal D from the repair means 11 always is maintained at a high state. As the such output signal D from the repair means 11 maintained at a high state is inputted by the NAND gate G13, the output from the NAND gate G13 can vary only with the control signal EQYB. As the fuses F11 and F12 in the main fuse means 12 are cut, the output signal C from the main fuse means 12 always is at a high state enabling the n-channel MOSFET T12 to always be at ON state. On the other hand, the n-channel MOSFET T11 is made ON state only when the control signal EQYB is at a low state. Therefore, only when the control signal EQYB is at a low state, current can flow through the n-channel MOSFETs T11 and T12 coupled series with each other.

As hereinbefore described, the present invention can provide the repair circuit for integrated circuits which is capable of reducing power consumption therein by allowing current to flow thereinto only when address is varied, differently from the conventional repair circuit. Therefore, the present invention can be applied to all repair circuits requiring small consumption power on design of the storage device.

Although the preferred embodiments of the invention have been disclosed for illustrative purpose, those skilled in the art will appreciate that various modifications, additions and substitutions are possible, without departing from the scope and spirit of the invention as disclosed in the accompanying claims.

What is claimed is:

1. A repair circuit for integrated circuits comprising:
    a repair means including an output stage and adapted for selecting and repairing a storage cell having a fault;
    a main fuse means including an output stage and adapted for operating said repair means;
    a NAND gate G13 adapted for inputting an output signal from said repair means and a control signal;
    a first n-channel MOSFET T11 including a drain connected to said output stage of said repair means, a gate adapted to input an output from said NAND gate G13 and a source;
    a second n-channel MOSFET T12 including a gate adapted to input an output signal from said main fuse means, a drain connected to said source of said first n-channel MOSFET T11 and a source connected to a ground; and
    an inverter G14 connected to said output stage of said repair means for outputting a signal to repair said storage cell having fault.

2. A repair circuit for integrated circuits as claimed in claim 1, wherein said control signal transits from one level to other level as address is varied and transits again contrary after a predetermined time.

3. A repair circuit for integrated circuits as claimed in claim 1, wherein said repair means further comprises a plurality of p-channel MOSFETs each including a source connected to a power source, a gate adapted to input an address decoding output and a drain, and a, plurality of fuses each coupled parallel to said plurality of p-channel MOSFETs and including one stage connected to each drain of said plurality of p-channel MOSFETs and other stage connected to said output stage of said repair means.

* * * * *